United States Patent
Jamy et al.

(10) Patent No.: US 12,153,070 B2
(45) Date of Patent: Nov. 26, 2024

(54) CURRENT SENSOR COIL ASSEMBLY WITH POTTING COMPOUND

(71) Applicant: EGSTON SYSTEM ELECTRONICS EGGENBURG GMBH, Eggenburg (AT)

(72) Inventors: Roman Jamy, Neupölla (AT); Ernst Prand-Stritzko, Langau (AT); Daniel Erdösi, Eggenburg (AT); Martin Högenauer, Zissersdorf (AT)

(73) Assignee: EGSTON SYSTEM ELECTRONICS EGGENBURG GMBH, Eggenburg (AT)

( * ) Notice: Subject to any disclaimer, the term of this patent is extended or adjusted under 35 U.S.C. 154(b) by 0 days.

(21) Appl. No.: 18/291,099

(22) PCT Filed: Jul. 19, 2022

(86) PCT No.: PCT/EP2022/070180
§ 371 (c)(1),
(2) Date: Jan. 22, 2024

(87) PCT Pub. No.: WO2023/001811
PCT Pub. Date: Jan. 26, 2023

(65) Prior Publication Data
US 2024/0264202 A1    Aug. 8, 2024

(30) Foreign Application Priority Data
Jul. 21, 2021   (AT) .............................. A 50605/2021

(51) Int. Cl.
*G01R 15/18*     (2006.01)
*B29C 39/00*     (2006.01)
(Continued)

(52) U.S. Cl.
CPC .......... *G01R 15/181* (2013.01); *B29C 39/003* (2013.01); *B29C 39/10* (2013.01);
(Continued)

(58) Field of Classification Search
CPC ..... G01R 15/181; B29C 39/003; B29C 39/10; B29K 2063/00; B29K 2075/00;
(Continued)

(56) References Cited

U.S. PATENT DOCUMENTS 4,091,139 A     5/1978  Quirk
2007/0205749 A1*  9/2007  Yakymyshyn ....... G01R 15/207
                                          324/117 R
(Continued)

FOREIGN PATENT DOCUMENTS

DE     2002192 A1    12/1970
DE     4429959 A1    2/1996
(Continued)

OTHER PUBLICATIONS

Austria Application No. A 50605/2021, Office Action mailed Aug. 9, 2022, 3 pages.
(Continued)

*Primary Examiner* — Jay Patidar
(74) *Attorney, Agent, or Firm* — Liang & Hennessey LLP; Brian Hennessey

(57) ABSTRACT

In a current sensor coil assembly (1) comprising at least one sensor air coil (2), which sensor air coil (2) is designed as a Rogowski coil (3), wherein the current sensor coil assembly (1) has a housing (4), which housing (4) comprises the Rogowski coil (3), it is proposed that the Rogowski coil (3) is embedded in a potting compound (5), that the potting compound (5) comprises at least one first material and one second material, that the first material is an electrical insulating material, in that the second material comprises par-
(Continued)

ticles having predeterminable electrical conductivity, and that the potting compound (5) has a specific electric resistance between 10 Ω·cm and 6000 Ω·cm, in particular between 500 Ω·cm and 5000 Ω·cm, preferably between 2000 Ω·cm and 3000 Ω·cm.

15 Claims, 4 Drawing Sheets

(51) Int. Cl.
    *B29C 39/10*     (2006.01)
    *B29K 63/00*     (2006.01)
    *B29K 75/00*     (2006.01)
    *B29K 105/16*     (2006.01)
    *B29K 507/04*     (2006.01)
    *B29K 509/02*     (2006.01)
    *B29L 31/34*     (2006.01)

(52) U.S. Cl.
    CPC ...... *B29K 2063/00* (2013.01); *B29K 2075/00* (2013.01); *B29K 2105/16* (2013.01); *B29K 2507/04* (2013.01); *B29K 2509/02* (2013.01); *B29K 2995/0007* (2013.01); *B29L 2031/3481* (2013.01)

(58) Field of Classification Search
    CPC ............ B29K 2105/16; B29K 2507/04; B29K 2509/02; B29K 2995/0007; B29L 2031/3481

See application file for complete search history.

(56) References Cited

U.S. PATENT DOCUMENTS

| | | | |
|---|---|---|---|
| 2011/0140694 | A1 | 6/2011 | Cima et al. |
| 2013/0207638 | A1* | 8/2013 | Gross ...................... H01F 38/30 |
| | | | 323/358 |

FOREIGN PATENT DOCUMENTS

| | | | |
|---|---|---|---|
| EP | 0510311 | A2 | 10/1992 |
| EP | 1302773 | B1 | 4/2003 |
| EP | 0901705 | B1 | 9/2003 |
| EP | 2982993 | A1 | 2/2016 |
| EP | 3965126 | A1 | 3/2022 |
| WO | 2006086045 | A2 | 8/2006 |
| WO | 2009139521 | A1 | 11/2009 |

OTHER PUBLICATIONS

International Application No. PCT/EP2022/070180, International Search Report and Written Opinion mailed Oct. 27, 2022, 14 pages.
International Application No. PCT/EP2022/070180, International Preliminary Report on Patentability mailed Oct. 24, 2023, 54 pages.

* cited by examiner

CURRENT SENSOR COIL ASSEMBLY WITH POTTING COMPOUND

The invention relates to a current sensor coil assembly.

Current measuring assemblies are known which have a wound ring core coil as the actual sensor element, which ring core coil fully comprises the current line to be measured, but without being directly mechanically connected thereto.

Different current sensor coil assemblies are known here, which each have coils which comprise a primary conductor of an electric line to be measured. In particular iron core coils are known in this case, which are arranged in a steel plate housing.

Such current measuring assemblies have a large number of problems or faults, such as an extremely small measurable frequency band in the primary conductor, a low measurement accuracy, a large structural size, easy ability to be influenced by electric fields in the environment, etc. Even in the case of measurements on a 50 Hz network with small electrical ambient fields, such current sensor coil assemblies have deviations of 1% to 10%, and therefore only have limited suitability for detailed recordings. In environments having strong or very pronounced fields, for example in the emission region of flight navigation emitters (for example: ILS) and/or high-frequency partial currents in the primary conductor, for example caused by computer systems, further faults or problems occur. Incident electrical fields can furthermore also cause eddy currents in the housing, in addition to influencing the measurement process. Partial currents having higher frequencies can result in measurement errors or in the low-frequency currents also no longer being able to be measured due to the high-frequency currents.

Such current sensor coil assemblies are very restricted in their fields of use and can only be used if a high measurement accuracy of the amperage is irrelevant. Such systems can therefore no longer be used for detailed measurements in the modern presence, in which both high-frequency currents and numerous electrical fields prevail, rather only serve for a rough estimation, but are usable neither for safety purposes nor for other important measurements.

Furthermore, designing wound ring core coils as Rogowski coils is known. However, such Rogowski coils are used above all for individual special uses.

The object of the invention is therefore to specify a current sensor coil assembly of the type mentioned at the outset using which the mentioned advantages can be avoided, using which a high measurement accuracy can be achieved, which is usable in broad ranges, and which is producible easily and reliably.

This is achieved according to the invention by the features discussed herein.

A current sensor coil assembly having a Rogowski coil can thus be provided, which is usable as an electric meter in a power supply network, in particular comprising smart grids.

A predeterminable electromagnetic shielding can thus be achieved. The measurement accuracy can thus be significantly increased, and at the same time it can be ensured that the measurement is not manipulable. A low capacitive coupling can thus be achieved.

A galvanic isolation of the current sensor coil assembly from the conductors to be measured, which are also designated as primary conductors, can thus be ensured. A potential decoupling can be ensured, due to which the measurement signal is not disturbed.

A significantly broader frequency range can thus be achieved with respect to the metrological detection than with conventional iron cores.

Furthermore, an essentially linear saturation behavior can thus be achieved.

Eddy currents are kept small by the high-resistance conductive potting compound, by which the measurement accuracy can be increased. Moreover, the high-resistance conductivity of the potting compound also results in sufficient decoupling of the housing of the current sensor coil assembly from the Rogowski coil.

The current sensor coil assembly has very effective shielding with regard to both the mechanical structure and the electromagnetic effectivity. In particular current sensor coil assemblies, which only have a small structural size can be shielded very well in this way. A small structural size is in particular a Rogowski coil having an internal diameter of 5 mm-20 mm.

Such a potting compound can moreover be processed easily and is cost-effective with regard to the acquisition and the processing.

The invention relates to a method for producing a current sensor coil assembly.

The object of the invention is therefore to specify a method for producing a current sensor coil assembly using which the advantages mentioned at the outset can be avoided, and using which a current sensor coil assembly having high measurement accuracy and a broad usage range is producible easily and reliably.

This is achieved according to the invention by the features of discussed herein.

The advantages listed above can thus be achieved.

The dependent claims relate to further advantageous embodiments of the invention.

Reference is hereby expressly made to the wording of the claims, by which the claims are incorporated at this point by reference into the description and are considered to be reproduced verbatim.

The invention will be described in more detail hereinafter with reference to the appended drawings, in which only preferred embodiments are shown by way of example. In the figures.

Figure 4:
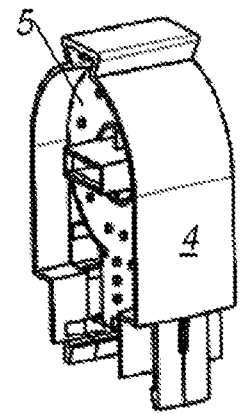
FIG. 4 shows a housing having potting compound arranged therein.
Figure 5:
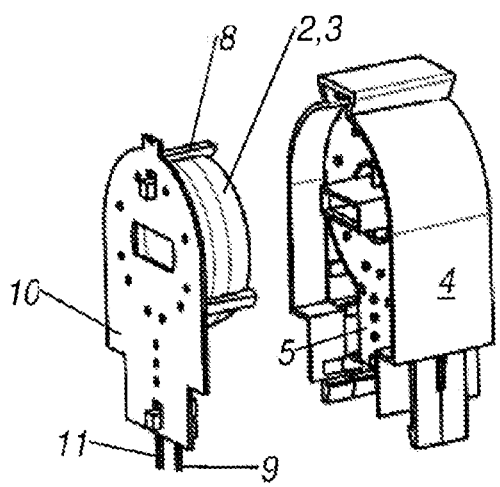
FIG. 5 shows the assembly according to FIG. 3 in the installed position in front of the assembly according to FIG. 4.
Figure 6:
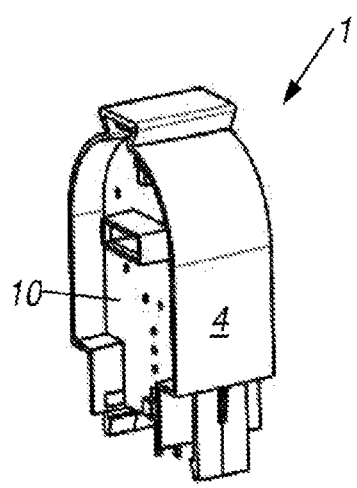
FIG. 6 shows a current sensor coil assembly consisting of the assembly according to FIG. 3 which is located inside the assembly according to FIG. 4.
Figure 10:
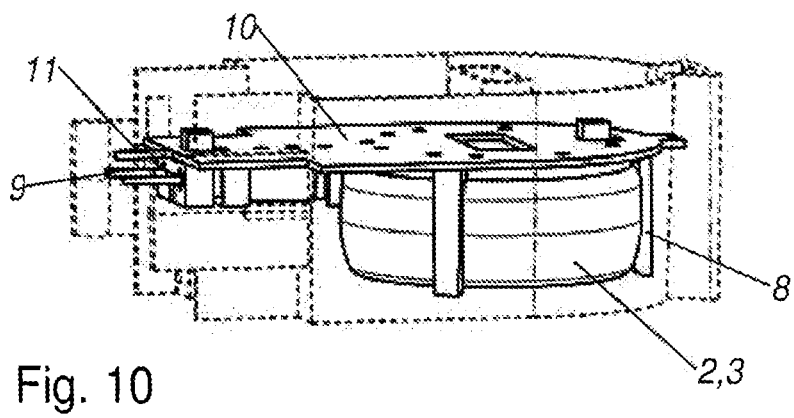
FIG. 10 shows the assembly according to FIG. 3 having a schematically shown housing.
Figure 11:
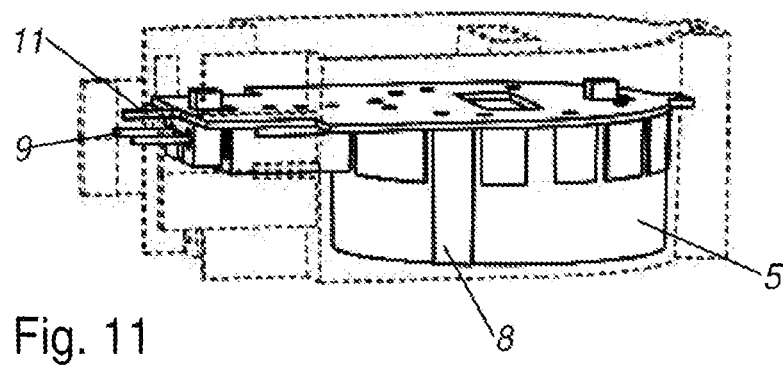
FIG. 11 shows the assembly according to FIG. 10 with illustration of a completely de-molded potting compound.
Figure 12:
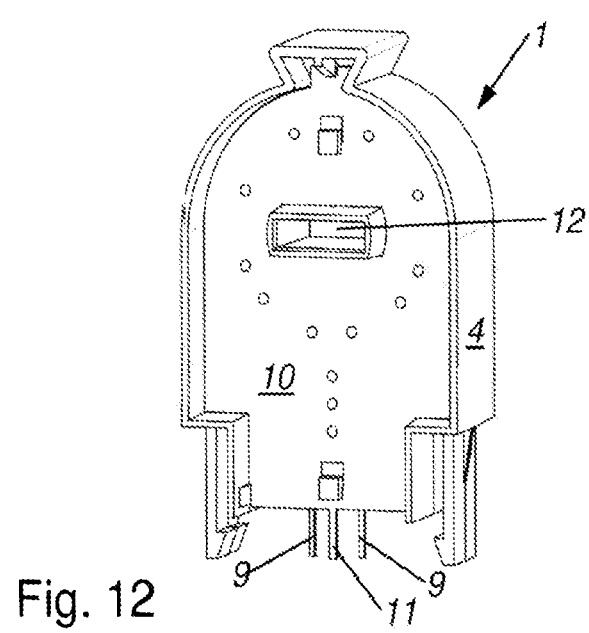
FIG. 12 shows a complete current sensor coil assembly.

FIGS. 1 to 12 show a current sensor coil assembly 1 comprising at least one sensor air coil 2, which sensor air coil 2 is designed as a Rogowski coil 3, wherein the current sensor assembly 1 has a housing 4, which housing 4 encloses the Rogowski coil 3, wherein the Rogowski coil 3 is embedded in a potting compound 5, wherein the potting compound 5 comprises at least one first material and one second material, wherein the first material is an electrical insulating material, wherein the second material comprises particles having predeterminable electrical conductivity, and wherein the potting compound 5 has a specific electrical resistance between 10 Ω·cm and 6000 Ω·cm, in particular between 500 Ω·cm and 5000 Ω·cm, preferably between 2000 Ω·cm and 3000 Ω·cm. FIGS. 6 and 12 show full views of the current sensor coil assembly 1 in the final manufacturing state here.

A current sensor coil assembly having a Rogowski coil can thus be provided, which is usable as an electric meter in a power supply network, in particular comprising smart grids.

A predeterminable electromagnetic shielding can thus be achieved. The measurement accuracy can thus be significantly increased, and it can be ensured at the same time that the measurement is not manipulable. A low capacitive coupling can thus be achieved.

A galvanic isolation of the current sensor coil assembly from the conductors to be measured, which are also designated as primary conductors, can thus be ensured. A potential decoupling can be ensured, due to which the measurement signal is not disturbed.

A significantly broader frequency range than with conventional iron cores can thus be achieved with respect to the metrological detection.

Furthermore, essentially linear saturation behavior can be achieved.

Eddy currents are kept small by the highly-resistant conductive potting compound, by which the measurement accuracy can be increased. Moreover, the high-resistance conductivity of the potting compound also results in sufficient decoupling of the housing of the current sensor coil assembly from the Rogowski coil.

The current sensor coil assembly has very effective shielding with respect to both the mechanical structure and the electromagnetic effectivity. In particular current sensor coil assemblies, which only have a small structural size can be shielded very well in this way. A small structural size is in particular a Rogowski coil having an internal diameter of 5 mm-20 mm.

Such a potting compound can moreover be easily processed and is cost-effective with respect to the acquisition and the processing.

As already described at the outset, current sensor coil assemblies 1 having wound ring core coils or sensor air coils 2 have been known for some time. The disadvantages of this prior art were already described.

Furthermore, using a Rogowski coil 3 as a sensor air coil 2 is known.

It has been shown that the use of a potting compound 5 as such, which is arranged around large or essential parts of the Rogowski coil 3, can have an influence on the measurement accuracy. Furthermore, it has been shown that the embodiment or the type of the potting compound 5 and/or the type of the arrangement or the positioning thereof on or in relation to the Rogowski coil 3 has a high influence on the measurement accuracy.

In the present case, this sensor air coil 2 is designed as a Rogowski coil 3. Rogowski coils 3 are also known with respect to their fundamental structure and are therefore not described in more detail in the present case in this regard.

The current sensor coil assembly 1 has a housing 4, in which the Rogowski coil 3 is arranged and which surrounds or encloses it. The housing 4 is preferably formed comprising plastic, wherein the housing 4 can also be formed from metal. Furthermore, the housing can comprise a combination of metal and plastic.

Moreover, the housing 4 has an opening 12 corresponding to the internal free area of the Rogowski coil 3, so that it is still possible to enclose an electrical conductor using the Rogowski coil 3. Moreover, still further components are assemblies are located in the housing 4 if the current sensor coil assembly 1 comprises such components or assemblies, as is preferably provided in the present case.

FIGS. 1 to 9 each show different points in time of the sequence of a method for producing a current sensor coil assembly 1, wherein a Rogowski coil 3 is fastened on a holding part 8, wherein the Rogowski coil 3 is connected to electrical connecting means 9 of the current sensor coil assembly 1, wherein the connected Rogowski coil 3 is connected together with the holding part 8 on one side to a shielding plate 10, wherein a predeterminable amount of a potting compound 5 having a specific electrical resistance between 10 Ω·cm and 6000 Ω·cm, in particular having a viscosity between 1 Pa·s and 1000 Pa·s, is introduced into a housing 4 of the current sensor coil assembly 1, wherein then the assembly made of connected Rogowski coil 3, holding part 8, and shielding plate 10 is introduced into the housing 4 and pressed against the potting compound 5, wherein the potting compound 5 is deformed and fills up a volume between the Rogowski coil 3 and an inner surface 7 of the housing 4 to a predeterminable extent.

Figure 1:
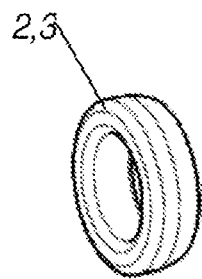
FIG. 1 shows a schematic representation of a wound ring core coil designed as a Rogowski coil.
Figure 2:
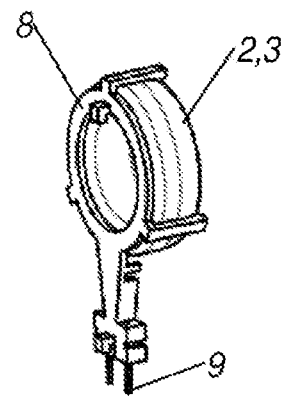
FIG. 2 shows a composite made up of the Rogowski coil and a holding part.

FIG. 1 shows a schematic representation of the Rogowski coil 3. The Rogowski coil 3 is fastened on the holding part 8. FIG. 2 shows a representation of a Rogowski coil 3 and a holding part 8 fastened thereon. The Rogowski coil 3 is furthermore connected to electrical connecting means 9 or connection parts or electrical contact parts of the current sensor coil assembly 1. This connection is necessary, but can be carried out during the construction or production of the current sensor coil assembly 1 when this is advantageous for manufacturing.

Figure 3:
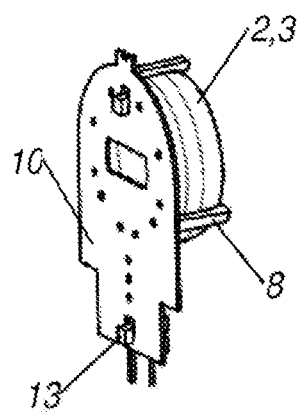
FIG. 3 shows the assembly according to FIG. 2 fastened on a shielding plate.

The combination made up of electrically connected Rogowski coil 3 and holding part 8 fastened thereon is connected on one side to a shielding plate 10. FIG. 3 shows such an assembly. The shielding plate 10 is arranged here on the holding part 8 and fastened thereon. The holding part 8 preferably has two or more locking rails 13 for this purpose, which pass through correspondingly formed contacting openings of the shielding plate 10. The corresponding fastening parts can also be designed differently, however, and/or can be arranged on the shielding plate 10 instead of on the holding part 8.

It is preferably provided that the Rogowski coil 3 is electrically checked. An electrical measurement is carried out on the Rogowski coil 3 in order to detect its properties. Any possible flaws can thus be detected and if necessary a further use or installation into the current sensor coil assembly 1 of specific Rogowski coils 3 can be avoided. It is advantageous if this check takes place before a further use of the Rogowski coil 3, such as an installation into the housing 4.

The Rogowski coil 3 is introduced into the housing 4. Before this takes place, a predeterminable amount of a potting compound 5 is introduced into the housing 4 or arranged therein. FIG. 4 shows a housing 4 having a potting compound 5 arranged therein. The potting compound 5 shown already has a shape as if it had already been partially or completely deformed, which is not yet the case, however. The special properties of the potting compound 5 will be described hereinafter.

After the potting compound 5 has been introduced into the housing 4, the assembly made of Rogowski coil 3, holding part 8, and shielding plate 9—connected to one another—is introduced into the housing 4. FIG. 5 shows the corresponding components or assemblies before their combination. The potting compound 5 is not yet cured at this point in time, and has a predeterminable deformation capability connected to a certain viscosity in this case. In particular, the potting compound 5 has a viscosity between 1 Pa·s and 1000 Pa·s.

Figure 7:
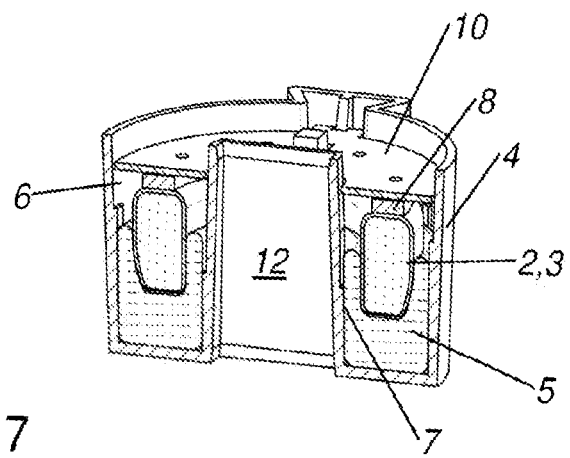
FIG. 7 shows a sectional view through a housing during the introduction of the assembly according to FIG. 3.
Figure 8:
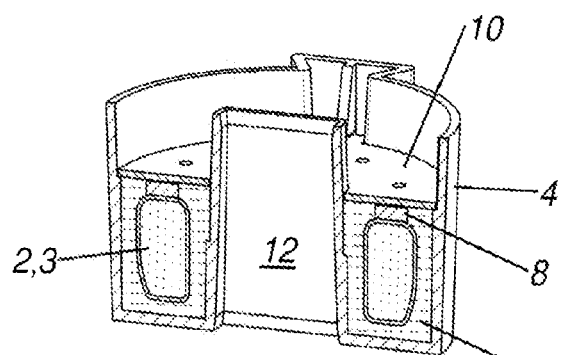
FIG. 8 shows the assembly according to FIG. 7 after a completed introduction process.

The potting compound 5 is deformed and displaced by the pressure, and thus fills up large areas of the interior of the housing 4. FIG. 6 shows the already assembled current sensor coil assembly 1. FIGS. 7 and 8 show two parts of this process, having different positions of the corresponding parts.

It is preferably provided that the amount of the potting compound 5 which is introduced into the housing 4 is sufficiently large so that the potting compound 5 contacts plate 10 in the assembled state. Furthermore, it is preferred for the amount of the potting compound 5 to be sufficiently small to leave individual areas of the Rogowski coil 3 free or to not envelop them completely when the Rogowski coil 3 is located in the housing 4 in the installed final state.

It is preferably provided that the potting compound 5 essentially completely fills up at least one predeterminable area 6 between the Rogowski coil 3 and at least one inner surface 7 of the housing 4. In this way, the mechanical position of the Rogowski coil 3 can be ensured, and also the shielding effect of the potting compound 5 can be ensured. In particular, it is provided here that at least two-thirds of an outer surface of the Rogowski coil 3 are enclosed, preferably touched, by the potting compound 5. The shielding is thus improved. The at least one inner surface 7 is preferably a central part of the housing which encloses the opening 12. This area is also shown in FIG. 7.

It would be advantageous for the potting compound 5 to enclosed or pack the Rogowski coil 3 without touching or contacting it itself. Furthermore, it has proven to be advantageous for the shielding effect of the potting compound 5 if the potting compound 5 directly contacts the Rogowski coil 3 on large areas.

Figure 9:
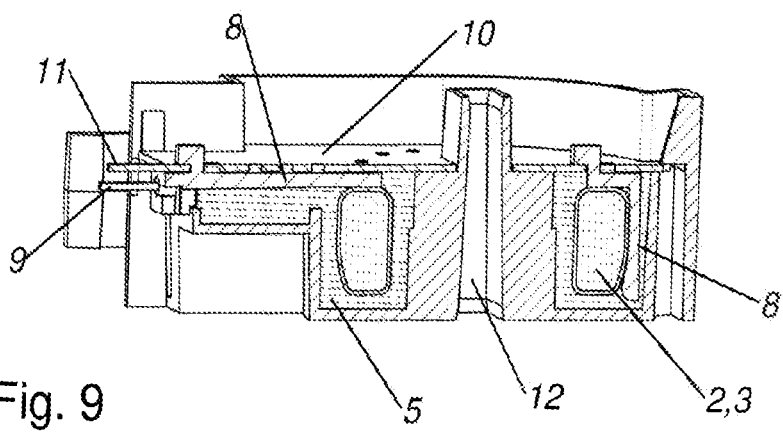
FIG. 9 shows a sectional view through the current sensor coil assembly according to FIG. 8, wherein the angle of section is arranged at 90° to FIGS. 7 and 8.

FIGS. 7, 8, and 9 each show sectional views of the current sensor coil assembly 1. FIG. 7 shows a snapshot during the introduction of Rogowski coil 3, holding part 8, and shielding plate 10 into the housing 4. The potting compound 5 is located in the middle in the forming process taking place here and first touches the lower side and half the lateral areas of the Rogowski coil 3. FIGS. 8 and 9 show sections after the completed introduction process. The Rogowski coil 3 is surrounded by the potting compound 5, which can also be designated as a potting material, potting substance, or potting mass. It can furthermore also be seen well here how the potting compound 5 contacts the shielding plate 10.

It is preferably provided that the potting compound 5 is electrically contacted with a predeterminable electrical potential. It is therefore particularly preferably provided that the shielding plate 10 has a ground connection 11, and the potting compound 5 is connected to the ground connection 11. It can thus be ensured that the potting compound 5 is applied to an electrical potential and only reacts slightly to electrical waves or radiation or fields.

FIG. 10 shows the assembly made up of Rogowski coil 3, holding part 8, and shielding plate 10 and furthermore the surrounding parts of the housing 4, which are illustrated by dashed lines. FIG. 11 shows a corresponding view, wherein the potting compound 5, which conceals the Rogowski coil 3, is also shown, however.

It is provided that the potting compound 5 has a specific electrical resistance between 10 Ω·cm and 6000 Ω·cm, in particular between 500 Ω·cm and 5000 Ω·cm, preferably between 2000 Ω·cm and 3000 Ω·cm. According to a particularly preferred embodiment, the specific electrical resistance is preferably between 2400 Ω·cm and 2700 Ω·cm. The measurement accuracy can already be significantly increased by this property. Such a resistance ensures that incident signals are significantly damped and bound in the potting compound 5. In addition to the unit presently used for the specific electrical resistance: 52 cm, other units are also typical or widespread, such as Ω·mm$^2$/m. A conversion between these units is mathematically simple.

To measure the specific resistance of the potting compound 5, it is preferably provided that the potting compound 5 is poured in an uncured or unhardened state between two electrodes of a measurement setup or a measurement assembly. The relevant free space is therefore cast using the potting compound 5. Subsequently, it is waited until the potting compound 5 is cured or hardened. The electrical resistance between these two electrodes of the measurement setup is then measured. This resistance measurement is preferably carried out here in a conventional manner.

Furthermore, it is preferably provided that the specific electrical resistance of the potting compound is 500 to 2000 times greater than the specific electrical resistance of the Rogowski coil 3. Since the electrical conductivity is inversely proportional to the specific electrical resistance, it is therefore preferably provided that the potting compound 5 has an electrical conductivity which is 500 to 2000 times less than an electrical conductivity of the Rogowski coil 3. It can be ensured by the higher electrical resistance of the potting compound 5 in comparison to that of the Rogowski coil 3 that—even in the event of a minor leak at an outer surface of the Rogowski coil 3—the measurement accuracy of the current sensor coil assembly 1 is practically not impaired.

The specific electrical resistance, which is also designated by a person skilled in the art solely as the specific resistance, is a material or substance property. The specific electrical resistance is not a property of a component which has certain dimensions. In numerous materials, in particular in metals, which are typically used in electrical engineering for conductors or coils, thus copper, aluminum, and/or silver, the specific electrical resistance is known in each case. The specific electrical resistance of the material or the alloy used is preferably specified in a datasheet of the producer of the material used. Otherwise, the specific electrical resistance is easily determinable metrologically in a wire-shaped conductor, of which the Rogowski coil 3 typically consists. For this purpose, the resistance, the cross-sectional area, and the length of a wire-shaped conductor are measured and the specific electrical resistance is calculated therefrom. The formula for this calculation is contained in fundamental literature of electrical engineering or corresponding training books or schoolbooks.

The specific electrical resistance of the potting compound 5 can also be specified in a corresponding datasheet. Alternatively thereto, however, this can also be specified metrologically. It can be provided here that in a first step, a sample or a part of the potting compound 5, which was removed, for example, from a finished current sensor coil assembly 1, is studied with respect to its chemical composition and/or its internal structure and/or its status. A sample specimen can be produced from the same material on the basis of the results of this study, which sample specimen also has the same internal structure and/or the same internal construction and/or the same material composition as the sample or the part of the potting compound 5 which was removed from the current sensor coil assembly 1. After its production, the sample specimen is preferably checked for its chemical composition and/or its internal structure and/or the same material composition and it is monitored that the sample specimen is accordingly equivalent to the sample. As a result, the sample specimen also has the same specific electrical resistance as said sample of the potting compound 5. The determination of the specific electrical resistance of the potting compound 5 is then performed on the basis of a metrological method for plastics or elastomers. In particular, a method according to DIN IEC 60093 and/or DIN EN 62631-3-1 is provided in this regard. To determine the specific electrical resistance of the potting compound 5, it is preferably provided that the sample specimen has a predeterminable shaping and predeterminable dimensions. In this case, the sample specimen has a planar shape having plane-parallel contact surfaces. Two plate electrodes are connected to these contact surfaces or the contact surfaces are clamped between the two plate electrodes. A predeterminable voltage is then applied and the electric current—flowing through the sample specimen—is measured. The specific electrical resistance can then be determined from the direct measurement results and the known dimensions.

The positive effect of the potting compound 5 can be increased still further in that it is preferably essentially non-ferromagnetic. The measurability or measurement accuracy can be ensured in this way. It has been shown that ferromagnetic materials can result in shielding of the Rogowski coil 3 and current measurements can no longer take place.

The potting compound 5 comprises at least one first material and one second material, which differ and have partially different properties taken as such, but which are together part of the potting compound 5, however.

The first material is or comprises an electrical insulating material. Any material which is insulating and deformable in a predeterminable manner can be used as the first material as such. An insulating material is preferably a material or immaterial composite having a conductivity which is less than $1\times10^{-11}$ 1/Ω·cm. This conductivity is preferably between $1\times10^{-11}$ 1/Ω·cm and $1\times10^{-13}$ 1/Ω·cm. The relevant values for the conductivity relate to a measurement temperature of approximately 80° C.

In particular, the first material or the insulating material is or comprises epoxy and/or polyurethane and/or silicon. The first material is preferably essentially formed in large parts, in particular essentially completely, from one of these three materials. Each of these materials has proven to be advantageous for the production of present potting compounds 5 and the storage and processing thereof in a present housing 4. A preferably used first material has an electrical conductivity of approximately $3.3\times10^{-11}$ 1/Ω·cm at 80° C.

The first material particularly preferably also comprises a so-called filler. Different mineral materials, corundum, aluminum hydroxide, and/or different quartz compounds have proven to be preferred fillers.

The first material preferably forms a base or a majority of the potting compound 5. It is provided in particular in this case that the first material comprises or forms at least 50%, preferably at least 70%, in particular at least 85% of the total weight of the potting compound 5. It can be particularly preferably provided that up to 98% of the total weight of the potting compound 5 is formed by the first material. The specified fractions or percentages of the total weight are identical to the fraction or percentage of the mass upon a measurement of the different materials under equal or identical gravitational force or equal or identical gravitational acceleration.

The second material comprises particles having predeterminable electrical conductivity or the particles are materials having corresponding sufficient electrical conductivity. Which value of an electrical conductivity is at least sufficient is dependent on different environmental parameters. It has proven to be advantageous if the one electrical conductivity is greater than 0.04 m/Ω·mm².

According to a first preferred embodiment of the particles of the second material, it is provided the particles of the second material comprise or are at least one predeterminable carbon black, in particular acetylene carbon black. Other types of a carbon black can also be provided here. Carbon black has proven to be particularly advantageous here with respect to its electrical and mechanical properties. A material which is otherwise not conductive can be made electrically conductive in a targeted and predeterminable manner by the use of carbon black. At the same time, a predeterminable high electric resistance can be achieved.

Carbon black can have different size ratios and shapes. It is preferably provided that a majority of the carbon black particles have a BET of 60 m² to 80 m² and a diameter of 30 nm to 50 nm.

According to a second preferred embodiment of the particles of the second material, it is provided that the particles of the second material comprise or are predeterminable metal threads, in particular comprising copper and/or silver and/or aluminum. All of the preferred metals have very high electrical conductivities and the technical properties and processing thereof are known to a person skilled in the art.

According to a third preferred embodiment of the particles of the second material, it is provided that the particles of the second material comprise or are predeterminable mineral fibers, in particular comprising graphite. It is particularly preferably provided here that the particles of the second material are formed as fibers which comprise at least 80% carbon. The percentage specifications relate in particular to mass percent. Carbon or graphite has proven to be particularly advantageous in this regard. However, some materials also have a sufficiently high conductivity and corresponding mechanical properties.

According to a fourth preferred embodiment of the particles of the second material, it is provided that at least two or all three of the above-described preferred embodiments are combined.

The second material is important in particular for the electrical conductivity and simultaneous damping of the potting compound 5. It is preferably provided that the second material comprises between 2% to 10%, preferably essentially 5%, of the total weight of the potting compound 5.

Furthermore, the potting compound 5 can contain still further materials, which are used, for example, as curing agents or cause other properties which are reasonable for the use of the potting compound 5.

The particles of the second material—together with the dimensions of their environment—also have an influence on the above-mentioned viscosity of the potting compound 5. It has been shown that at a length of the particles of essentially 6 mm with significantly greater dimensions of the surrounding housing or the space which is or was spotted using the potting compound, the viscosity is between 1 Pa·s and 100 Pa·s. Furthermore, it has been shown that—at the same dimensions of the particles—the viscosity is in a range between 100 Pas and 1000 Pa's if the surrounding housing or the relevant space has dimensions which are in the same or a similar order of magnitude as the dimensions of the particles. This is provided, for example, if the potting compound 5 having particles having a length of approximately 6 mm is located in a tube having a diameter of approximately 2 mm. It is preferably provided as the measurement method for determining the viscosity that the potting compound 5 is poured into a first tube of a measurement assembly having an internal diameter of 70 mm. One end of the first tube adjoins a second tube of the measurement assembly having an internal diameter of 2 mm. The potting compound 5 is then pressed from the first tube into the second tube. In this measurement assembly, the potting compound 5 preferably has a viscosity of 100 Pa·s and 1000 Pa·s.

Principles for understanding and interpreting the present disclosure are listed hereinafter.

Features are typically introduced with an indefinite article "a, an, one". If the context does not indicate otherwise, "a, an, one" is therefore not to be understood as a numeral.

The conjunction "or" is to be interpreted as inclusive and not as exclusive. If the context does not indicate otherwise, "A or B" also comprises "A and B", wherein A" and "B" represent arbitrary features.

In particular a feature X or a subject matter Y is differentiated into multiple embodiments by means of an ordinal number, for example, "first", "second", or "third", if not defined differently by the disclosure of the invention. In particular, a feature X or subject matter Y having an ordinal number in a claim does not mean that a design of the invention falling under this claim has to have a further feature X or a further subject matter Y.

An "essentially" in conjunction with a numeric value also comprises a tolerance of ±10% around the specified numeric value if the context does not indicate otherwise.

Endpoints are also comprised in value ranges, if the context does not indicate otherwise.

The invention claimed is:

1. A current sensor coil assembly comprising:
    at least one sensor air coil designed as a Rogowski coil;
    a housing comprising the Rogowski coil; and
    a potting compound arranged in the housing, the Rogowski coil being embedded in the potting compound; and
    wherein the potting compound comprises at least one first material and one second material, the first material being an electrical insulating material, the second material comprising particles having pre-determined electrical conductivity, and the potting compound having a specific electric resistance between 500 Ω·cm and 5000 Ω·cm.

2. The current sensor coil assembly as claimed in claim 1, wherein the potting compound substantially completely fills up at least one pre-determined area between the Rogowski coil and at least one inner surface of the housing.

3. The current sensor coil assembly as claimed in claim 1, wherein at least two thirds of an outer surface of the Rogowski coil is enclosed by the potting compound.

4. The current sensor coil assembly as claimed in claim 1, wherein the potting compound has a specific electrical resistance which is 500 to 2000 times greater than a specific electric resistance of the Rogowski coil.

5. The current sensor coil assembly as claimed in claim 1, wherein the potting compound is substantially non-ferromagnetic.

6. The current sensor coil assembly as claimed in claim 1, wherein the second material comprises between 2% to 10% of a total weight of the potting compound.

7. The current sensor coil assembly as claimed in claim 1, wherein the particles of the second material comprise at least one pre-determined carbon black.

8. The current sensor coil assembly as claimed in claim 1, wherein the first material comprises at least 50% of a total mass of the potting compound.

9. The current sensor coil assembly as claimed in claim 1, wherein the electrical insulating material of the first material comprises at least one of epoxy, polyurethane, and silicon.

10. The current sensor coil assembly as claimed in claim 1, wherein the potting compound is electrically connected to a ground connection.

11. A method for producing a current sensor coil assembly, comprising:
    fastening a Rogowski coil on a holding part, the Rogowski coil being connected to electrical connecting means of the current sensor coil assembly, wherein the connected Rogowski coil together with the holding part is connected on one side to a shielding plate;
    first introducing a pre-determined amount of a potting compound into a housing of the current sensor coil assembly, the potting compound comprising at least one first material and one second material, the potting compound having a specific electric resistance between 500 Ω·cm and 5000 Ω·cm;
    second introducing, after the first introducing, an assembly comprising the connected Rogowski coil, the holding part, and the shielding plate into the housing;
    pressing the assembly against the potting compound; and
    deforming the potting compound, the potting compound filling up a volume between the Rogowski coil and an inner surface of the housing to a pre-determined extent.

12. The method as claimed in claim 11, further comprising electrically checking the Rogowski coil before the second introducing operation.

13. The method as claimed in claim 11, wherein the shielding plate comprises a ground connection, the potting compound being connected to the ground connection.

14. The method as claimed in claim 11, wherein an amount of the potting compound introduced into the housing is sufficiently large that the potting compound in the assembled state contacts the shielding plate.

15. The method as claimed in claim 11, wherein the potting compound before curing has a viscosity between 1 Pa·s and 1000 Pa·s.

* * * * *